US00RE40114E

(19) United States
(12) Reissued Patent
Sandhu

(10) Patent Number: US RE40,114 E
(45) Date of Reissued Patent: Feb. 26, 2008

(54) TUNGSTEN SILICIDE ($WSI_X$) DEPOSITION PROCESS FOR SEMICONDUCTOR MANUFACTURE

(75) Inventor: Gurtej S. Sandhu, Boise, ID (US)

(73) Assignee: Micron Technology, Inc., Boise, ID (US)

(21) Appl. No.: 09/023,146

(22) Filed: Feb. 12, 1998

Related U.S. Patent Documents

Reissue of:
(64) Patent No.: 5,231,056
Issued: Jul. 27, 1993
Appl. No.: 07/821,188
Filed: Jan. 15, 1992

(51) Int. Cl.
*H01L 21/44* (2006.01)

(52) U.S. Cl. ..... 438/683; 438/685
(58) Field of Classification Search ..... 438/652, 438/656, 655, 677, 683
See application file for complete search history.

(56) References Cited

U.S. PATENT DOCUMENTS 4,565,157 A 1/1986 Brors et al.
4,632,057 A * 12/1986 Price et al. ..... 118/719
4,684,542 A * 8/1987 Jasinski et al. ..... 437/245
4,800,105 A 1/1989 Nakayama et al.
4,805,005 A 2/1989 Usagawa et al.
4,851,295 A * 7/1989 Brors ..... 437/200
4,902,645 A * 2/1990 Ohba ..... 148/DIG. 19
4,966,869 A * 10/1990 Hillman et al. ..... 437/200

FOREIGN PATENT DOCUMENTS

JP 0720419 * 5/1988
JP 2-39528 7/1988
JP 0066173 * 3/1990

OTHER PUBLICATIONS

"Properties of WSix using dichlorosilane in a single–wax system", T.H. Tom Wu, Richard S. Rosler, Bruce C. Lamartine, Richard B. Gregory, and Harland G. Tompkins; accepted Jul. 14, 1988; American Vacuum Society 1988.*

* cited by examiner

*Primary Examiner*—W. David Coleman
(74) *Attorney, Agent, or Firm*—TraskBritt

(57) ABSTRACT

A semiconductor manufacturing process for depositing a tungsten silicide film on a substrate includes deposition of a tungsten silicide nucleation layer on the substrate using a (CVD) process with a silane source gas followed by deposition of the tungsten silicide film with a dichlorosilane source gas. This two step process allows dichlorosilane to be used as a silicon source gas for depositing a tungsten silicide film at a lower temperature than would otherwise by possible and without plasma enhancement. Tungsten silicide films deposited by this process are characterized by low impurities, good step coverage, and low stress with the silicon substrate.

47 Claims, 1 Drawing Sheet

TUNGSTEN SILICIDE ($WSI_X$) DEPOSITION PROCESS FOR SEMICONDUCTOR MANUFACTURE

Matter enclosed in heavy brackets [ ] appears in the original patent but forms no part of this reissue specification; matter printed in italics indicates the additions made by reissue.

TECHNICAL FIELD

This invention relates to semiconductor manufacture and more particularly to a novel process for the deposition of tungsten silicide ($WSi_x$) films.

BACKGROUND OF THE INVENTION

Refractory metals and their silicides are often used in semiconductor manufacture. One silicide that is of particular interest in the formation of MOS and CMOS integrated circuits is tungsten silicide. Tungsten silicide, generally in the form of ($WSi_2$), can be used in the formation of integrated circuits as an intermediate, barrier, or conducting film. Tungsten silicide can also be used with polysilicon as a polycide-gate in transistor formation. Among the useful properties of tungsten silicide are its low bulk resistance and low stress.

In the formation of a tungsten silicide film, the film quality and step coverage provided by the deposited film greatly influences the completed semiconductor devices. This is because poor step coverage and an irregular surface topography generated by multi-layer processes causes serious difficulties for subsequent processing steps such as lithography, deposition, and etching. Poor step coverage and high stress may also degrade device reliability by causing stress induced cracking. Moreover, impurities in the deposited film may degrade device reliability and cause metal migration.

Chemical vapor deposition (CVD) is typically utilized in the deposition of tungsten silicide. In general (CVD) is favored because the deposited film has lower impurities and better step coverage than a sputtered film. In such a (CVD) system the reaction chemistry is typically based on the reaction of a silicon source gas, such as silane ($SiH_4$), with a reactant gas, such as tungsten hexaflouride ($WF_6$). One advantage of a (CVD) deposition process of tungsten silicide using this reaction chemistry is that because of the high reactivity of silane ($SiH_4$) and tungsten hexaflouride ($WF_6$), relatively low process temperatures can be utilized. These deposition temperatures are typically in the range of 250°-400° C. A disadvantage of a (CVD) deposition process of tungsten silicide using this reaction chemistry is the very high levels of fluorine impurities in the deposited film. In addition, step coverage may be poor.

In order to provide a tungsten silicide film having a lower impurity content and a better step coverage, a (CVD) reaction chemistry using higher order silanes such as dislane dichlorosilane and trislane have been proposed. U.S. Pat. Nos. 4,684,542 to Jasinski et al. and U.S. Pat. No. 4,966,869 to Hillman et al. disclose such processes.

Such a process is also disclosed in the technical report entitled, "Properties of $WSi_x$ using dichlorosilane in a single-wafer system" reported in the J. Vac. Sci. Technol. B 6(6), Nov/Dec 1988. This process was carried out in a (CVD) cold-wall reactor using a reaction of tungsten hexafluoride ($WF_6$) and dichlorosilane ($SiH_2Cl_2$) gases.

In this prior art process plasma enhancement of the process gases using radio frequency-induced glow discharge, was required to obtain the thermal deposition. The resultant film was characterized by a much lower fluorine concentration than films deposited with a conventional $WF_6/SiH_4$ chemistry. In addition, films deposited with a dichlorosilane source gas are characterized by excellent step coverage.

Although this process allowed the tungsten silicide film to be deposited at relatively low process temperature (450°-650° C.), the requirement of plasma enhancement for thermal deposition tended to complicate the procedure. Such a complicated procedure may not be entirely suitable for large scale semiconductor manufacture. In addition plasma can cause degradation of devices due to radiation induced damage.

There is then a need in the art for a process suitable for large scale semiconductor manufacture for forming high quality tungsten silicide films at relatively low process temperatures. Accordingly, it is an object of the present invention to provide a process for depositing tungsten silicide at a relatively low process temperature. It is another object of the present invention to provide a process for depositing a tungsten silicide film using dichlorosilane as a silicon source gas such that a high quality film having low impurities, low stress, and good step coverage is provided. It is yet another object of the present invention to provide a process for depositing a high quality tungsten silicide film that is adaptable to large scale semiconductor manufacture.

SUMMARY OF THE INVENTION

In accordance with the present invention a novel process for depositing a tungsten silicide film is provided. The process of the invention, simply stated, includes the steps of; depositing a tungsten silicide nucleation layer on a substrate using silane as a silicon gas source and then switching to dichlorosilane as the silicon gas source to complete deposition of the tungsten silicide film. This two step process permits the dichlorosilane silicon source gas to react with a reactant gas at a relatively low temperature. In addition, this process can be performed in a cold wall (CVD) system without the need for plasma enhancement of the reactant gases. The reactant gas is preferably tungsten hexaflouride mixed with inert carrier gases.

Other objects, advantages and capabilities of the present invention will become more apparent as the description proceeds.

DESCRIPTION OF PREFERRED EMBODIMENTS

Figure 1:
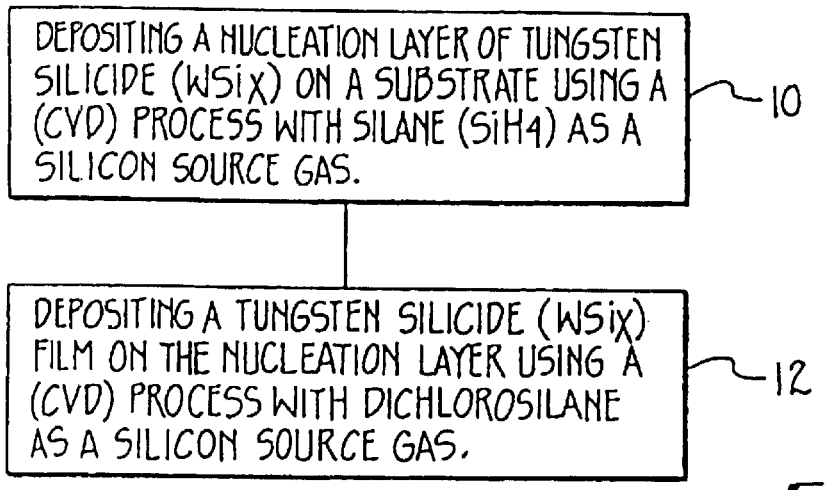
FIG. 1 is a flow diagram illustrating the basic steps of a process for depositing a tungsten silicide film in accordance with the process of the invention.

With reference to FIG. 1, the process of the invention is shown and broadly stated, comprises, a method for depositing a tungsten silicide ($WSi_x$) film on a substrate that includes the steps of:

depositing a nucleation layer of tungsten silicide ($WSi_x$) on a substrate using a (CVD) process with silane ($SiH_4$) as a silicon source gas and tungsten hexafluoride ($WF_6$), as a reactant gas, step 10; and depositing a tungsten silicide ($WSi_x$) film on the nucleation layer using a (CVD) process with dichlorosilane ($SiH_2Cl_2$) as a silicon source gas, step 12.

This process permits a high quality tungsten silicide ($WSi_x$) film to be deposited at relatively low temperatures in a cold walled (CVD) reaction chamber. Furthermore, the process can be carried out without a plasma enhancement of the (CVD) process.

Figure 2:
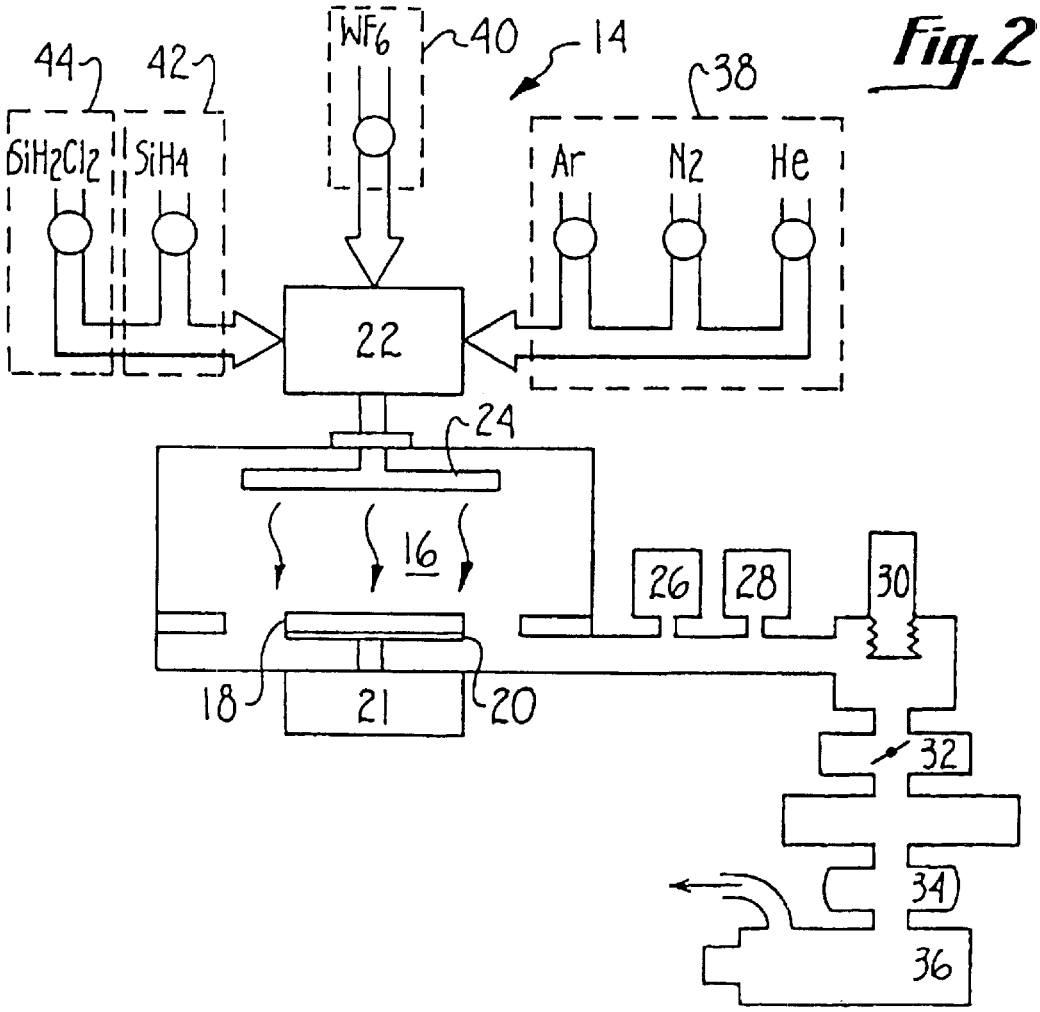
FIG. 2 is a schematic diagram of an apparatus for carrying out the process of the invention.

Referring now to FIG. 2 a cold wall (CVD) system 14 suitable for carrying out the method of the invention is shown. The cold wall (CVD) system 14 includes a reaction chamber 16 wherein a plurality of silicon wafers 18 may be located on a graphite boat 20. The graphite boat 20 is heated to a desired temperature by halogen lamps 21. The cold wall (CVD) system also includes a premix chamber 22 wherein the reactant and source gases are mixed prior to being directed through a shower head 24 into the reaction chamber 16. The cold wall (CVD) system 14 may also include pressure control means in the form of a pressure sensor 26, a pressure switch 28, an air operated vacuum valve 30, and a pressure control valve 32. In addition, reactant gases given off by the chemical reactions in the process chamber 16 are drawn by a roots blower 34 into a particulate filter 36 and to the atmosphere.

A supply of carrier gases 38 are coupled through suitable valving to the premix chamber 22. The carrier gases may include Argon, Nitrogen, and Helium or other suitable inert gases. A supply of a tungsten hexaflouride ($WF_6$) reactant gas 38 is also coupled to the premix chamber through suitable valving. A silicon source gas in the form of a silane ($SiH_4$) source gas 42 or dichlorosilane ($SiH_2Cl_2$) source gas 44 are also coupled to the premix chamber 22 through suitable valving.

With this arrangement the inert carrier gases (Ar, N2, He), and the reactant gas ($WF_6$) can be combined in the premix chamber 22 with the desired silicon source gas. This silicon source gas will initially be silane ($SiH_4$). This can be used to produce an initial nucleation layer of tungsten silicide ($WSi_x$) on the substrate. Following formation of the nucleation layer, the source gas is switched and dichlorosilane ($SiH_2Cl_2$) is used as the silicon source gas for deposition of the remainder of the tungsten silicide ($WSi_x$) film. The flow rate of the carrier gases (Ar, $N_2$, He) may be as great as five to ten times the flow rate of the silicon source gas (either silane or dichlorosilane). The flow rate of the silicon source gas (either silane or dichlorosilane) in turn may be about 50-100 times the flow rate of the reactant gas.

During the process of the invention, the pre-mixture gas combination (silicon source, reactant and carrier gases) is directed from the premix chamber 22 through the shower head 24 and into the reaction chamber 16. As these gases intermix inside the reaction chamber 16, they begin to react and deposit a uniform film of tungsten silicide ($WSi_x$) upon the heated surface of the silicon wafers 18. The pressure control components 26, 28 and 30 can be utilized to monitor and maintain a desired pressure during the process. The flowrates of the gases (silicon source, reactant and carrier) can also be controlled to achieve the desired reaction and film quality.

Using this arrangement it is desirable to initially deposit a nucleation layer of tungsten silicide ($WSi_x$) on the silicon wafers 18 using a silane ($SiH_4$) silicon source for a relatively short time such that a thin or discontinuous nucleation layer is formed on the surface of the silicon wafers 18. By way of example and not limitation, at a temperature of about 450° C. and with a silane flow rate of about 400 sccm, this nucleation layer is deposited in about 1-25 seconds. This requires a flow of reactant gas ($WF_6$) of about 4 sccm and a flow of inert gases (Ar, N2, He) of about 2800 sccm. Following deposition of the nucleation layer the silicon source gas may be switched abruptly or gradually to dichlorosilane and the tungsten silicide film can be deposited to the desired thickness using the dichlorosilane as the source gas. As an example this thickness may be in the range of about 1000 to 3000 Å.

A temperature of the silicon wafers 18 during both steps of the deposition process (i.e. nucleation and deposition) will be on the order of about 450° C. or less and may be in the range of 200° C. to 500° C. This is lower than prior art deposition processes using dichlorosilane ($SiH_2Cl_2$) as a silicon gas source. This is because the initially deposited nucleation layer deposited with a silane silicon gas source can be performed at a relatively low temperature and allows the subsequent deposition process with the dichlorosilane sourse gas to also proceed at the lower temperature. In addition, with the nucleation layer deposited with a silane source gas there is no need to plasma enhance the (CVD) process.

The resultant film deposited with a dichlorosilane ($SiH_2Cl_2$) silicon gas source is characterized by a low impurity content and by a low stress with the silicon substrate. Moreover, the resultant tungsten silicide ($WSi_x$) film is characterized by a high quality step coverage. This permits the process to be utilized for high density applications such as in the conformal deposition of tungsten silicide ($WSi_x$) between closely spaced structures.

It is to be understood that although the present invention has been described with reference to a preferred embodiment, various modifications known to those skilled in the art, may be made to the process steps presented herein without departing from the invention as recited in the following claims.

I claim:

1. A process for depositing a tungsten silicide film on a substrate comprising:

depositing a nucleation layer of tungsten silicide [($WSi_x$)] on the substrate using a (CVD) process with a silane ($SiH_4$) silicon source gas and a reactant gas; and depositing a film of tungsten silicide [($WSi_x$)] on the nucleation layer using a (CVD) process by switching to dichlorosilane ($SiH_2Cl_2$) as a silicon source gas such that the dichlorosilane gas reacts with the reactant gas to form the tungsten silicide film *at a temperature of less than about 500° C.*

2. The process as recited in claim 1 and wherein:

a reactant gas for reaction with the silane and the dichlorosilane is tungsten [hexaflouride] *hexafluoride* ($WF_6$).

3. The process as recited in claim [2 and wherein] *1 further including*:

[the (CVD) process is carried] *carrying* out *each of the* (*CVD*) *processes* in a cold wall (CVD) reaction chamber.

4. The process as recited in claim [3 and wherein] *1 further including*:

[the (CVD) process is carried] *carrying* out *each of the* (*CVD*) *processes* at a temperature of about 400° C. or less.

5. The process as recited in claim [4] *1* and wherein:

the nucleation layer is formed with discontinuities or to a very thin thickness on the substrate.

6. The process as recited in claim [5 and wherein] *1 further including*:

[a premix chamber is used to mix] *mixing* the silane or dichlorosilane silicon source gas, the reactant gas and a carrier gas *in a premix chamber*.

7. The process as recited in claim 6 and wherein:

a flow rate of the carrier gas is about five to ten times a flow rate of the silane or dichlorosilane silicon source gas.

8. A semiconductor manufacturing process for depositing a tungsten silicide film on a substrate comprising:

depositing a thin or discontinuous nucleation layer of tungsten silicide [($WSi_x$)] on the substrate using a (CVD) process and reacting a silane ($SiH_4$) silicon source gas with a reactant gas in a CVD system having a premix chamber for combining the silicon source gas and the reactant gas; and depositing a film of tungsten silicide [($WSi_x$)] on the nucleation layer using a (CVD) process by switching to dichlorosilane ($SiH_2Cl_2$) as a silicon source gas such that the dichlorosilane gas reacts with the reactant gas to form the tungsten silicide film *at a temperature of less than about 500° C.*

9. The semiconductor manufacturing process as recited in claim 8 and wherein:

the reactant gas is tungsten hexafluoride ($WF_6$).

10. The semiconductor manufacturing process as recited in claim [9 and wherein] *8 further including*:

[the (CVD) process is performed] *performing each of the (CVD) processes* in a cold wall (CVD) system.

11. The semiconductor manufacturing process as recited in claim 10 and wherein:

the cold wall (CVD) system includes the premix chamber, a reaction chamber, a graphite boat for holding a plurality of silicon wafers, and means for heating the silicon wafers.

12. The semiconductor manufacturing process as recited in claim [11] *8* and wherein:

the substrate is silicon wafers and the wafers are heated to a temperature of between 200° to 500° C.

13. The semiconductor manufacturing process as recited in claim [12] *8* and wherein:

deposition of the nucleation layer occurs in about 1 to about 25 seconds.

14. The semiconductor manufacturing process as recited in claim [13] *8* and wherein:

a carrier gas includes a mixture of Argon, Nitrogen, and Helium.

15. The semiconductor manufacturing process as recited in claim 14 and wherein:

a flow rate of the silane silicon source gas is about 400 sccm;

a flow rate of the reactant gas is about 4 sccm; and a flow rate of the carrier gas is about 2800 sccm.

*16. The semiconductor manufacturing process as recited in claim 1 and wherein:*

*said depositing said nucleation layer of tungsten silicide and said depositing said film of tungsten silicide occur at a substantially equivalent temperature.*

*17. The semiconductor manufacturing process as recited in claim 8 and wherein:*

*said depositing said thin or discontinuous layer of tungsten silicide and said depositing said film of tungsten silicide occur at a substantially equivalent temperature.*

*18. A process for depositing a tungsten silicide film on a substrate using a (CVD) process, comprising:*

*introducing said substrate into a reaction chamber of said (CVD) process;*

*depositing a tungsten silicide nucleation layer on said substrate by introducing a silane silicon source gas and a reactant gas into said reaction chamber such that said silane silicon source gas reacts with said reactant gas to form the tungsten silicide nucleation layer; and*

*depositing a film of tungsten silicide on said nucleation layer of tungsten silicide by switching said silane silicon source gas to a dichlorosilane silicon source gas such that the dichlorosilane silicon source gas reacts with the reactant gas to form the tungsten silicide film, said switching said silane silicon source gas to said dichlorosilane silicon source gas occurring without interrupting said (CVD) process, wherein said depositing said tungsten silicide nucleation layer and said depositing said film of tungsten silicide occur at a substantially equivalent temperature.*

*19. The process as recited in claim 18 further including:*

*introducing tungsten hexafluoride ($WF_6$) as a reactant gas for reaction with the silane silicon source gas and the dichlorosilane silicon source gas.*

*20. The process as recited in claim 18 further including:*

*carrying out the deposition of said tungsten silicide nucleation layer and said tungsten silicide film in a cold wall (CVD) reaction chamber.*

*21. The process as recited in claim 18 further including:*

*carrying out the deposition of said tungsten silicide nucleation layer and said tungsten silicide film at a temperature of about 400° C. or less.*

*22. The process as recited in claim 18 further including:*

*mixing the silane silicon source gas or dichlorosilane silicon source gas, the reactant gas, and a carrier gas in a premix chamber.*

*23. The process as recited in claim 22 wherein:*

*a flow rate of the carrier gas is about five to ten times a flow rate of said silane silicon source gas or said dichlorosilane silicon source gas.*

*24. A semiconductor manufacturing process for depositing a tungsten silicide film on a substrate comprising:*

*depositing a discontinuous nucleation layer of tungsten silicide on the substrate using a (CVD) process and reacting a silane ($SiH_4$) silicon source gas with a reactant gas in a CVD system having a premix chamber for combining the silicon source gas and the reactant gas; and*

*depositing a film of tungsten silicide on the discontinuous nucleation layer using a (CVD) process by switching to dichlorosilane ($SiH_2Cl_2$) as a silicon source gas such that the dichlorosilane gas reacts with the reactant gas to form the tungsten silicide film.*

*25. The semiconductor manufacturing process as recited in claim 24 and wherein:*

*said depositing said discontinous nucleation layer of tungsten silicide and said depositing said film of tungsten silicide occur at a substantially equivalent temperature.*

*26. The semiconductor manufacturing process as recited in claim 24 further including:*

*introducing tungsten hexafluoride ($WF_6$) as the reactant gas.*

*27. The semiconductor manufacturing process as recited in claim 24 further including:*

*performing each of the (CVD) processes in a cold wall (CVD) system.*

*28. The semiconductor manufacturing process as recited in claim 27 wherein:*

*the cold wall (CVD) system includes the premix chamber, a reaction chamber, a graphite boat for holding a plurality of silicon wafers, and means for heating the silicon wafers.*

*29. The semiconductor manufacturing process as recited in claim 24 wherein:*

*heating the substrate to a temperature of between about 200° and 500° C., and wherein said substrate comprises a silicon wafer.*

*30. The semiconductor manufacturing process as recited in claim 24 further including:*

*depositing of the discontinuous nucleation layer for a timespan between about 1 and 25 seconds.*

*31. The semiconductor manufacturing process as recited in claim 24 further including:*

*a carrier gas comprising a mixture of Argon, Nitrogen, and Helium.*

*32. The semiconductor manufacturing process as recited in claim 31 further including:*

*introducing the silane silicon source gas at about 400 sccm;*

*introducing the reactant gas at about 4 sccm; and*

*introducing a carrier gas at about 2800 sccm.*

*33. A process for depositing a tungsten silicide film on a substrate consisting essentially of:*

*depositing a discontinuous nucleation layer of tungsten silicide on the substrate using a (CVD) process with a silane ($SiH_4$) silicon source gas and a reactant gas;*

*depositing a film of tungsten silicide on the discontinuous nucleation layer using a (CVD) process by switching to dichlorosilane ($SiH_2Cl_2$) as a silicon source gas such that the dichlorosilane gas reacts with the reactant gas to form the tungsten silicide film; and*

*wherein said depositing said discontinuous nucleation layer of tungsten silicide and said depositing said film of tungsten silicide occur at a substantially equivalent temperature.*

*34. The process as recited in claim 33 further including:*

*introducing tungsten hexafluoride ($WF_6$) as a reactant gas for reaction with the silane and the dichlorosilane.*

*35. The process as recited in claim 33 further including:*

*carrying out each of the (CVD) processes in cold wall (CVD) reaction chamber.*

*36. The process as recited in claim 33 further including:*

*carrying out each of the (CVD) processes at a temperature of about 400° C. or less.*

*37. The process as recited in claim 33 further including:*

*mixing the silane or dichlorosilane silicon source gas, the reactant gas and a carrier gas in a premix chamber.*

*38. The process as recited in claim 37 wherein:*

*a flow rate of the carrier gas is about five to ten times a flow rate of the silane or dichlorosilane silicon source gas.*

*39. A semiconductor manufacturing process for depositing a tungsten silicide film on a substrate consisting essentially of:*

*depositing a discontinuous nucleation layer of tungsten silicide on the substrate using a (CVD) process and reacting a silane ($SiH_4$) silicon source gas with a reactant gas in a CVD system having a premix chamber for combining the silicon source gas and the reactant gas; and*

*depositing a film of tungsten silicide on the discontinuous nucleation layer using a (CVD) process by switching to dichlorosilane ($SiH_2Cl_2$) as a silicon source gas such that the dichlorosilane gas reacts with the reactant gas to form the tungsten silicide film.*

*40. The semiconductor manufacturing process as recited in claim 39 and wherein:*

*said depositing said discontinuous nucleation layer of tungsten silicide and said depositing said film of tungsten silicide occur at a substantially equivalent temperature.*

*41. The semiconductor manufacturing process as recited in claim 39 further including:*

*introducing tungsten hexafluoride ($WF_6$) as the reactant gas.*

*42. The semiconductor manufacturing process as recited in claim 39 further including:*

*performing each of the (CVD) processes in a cold wall (CVD) system.*

*43. The semiconductor manufacturing process as recited in claim 42 wherein:*

*the cold wall (CVD) system includes the premix chamber, a reaction chamber, a graphite boat for holding a plurality of silicon wafers, and means for heating the silicon wafers.*

*44. The semiconductor manufacturing process as recited in claim 39 wherein:*

*heating the substrate to a temperature of between about 200° and 500° C., and wherein said substrate comprises a silicon wafer.*

*45. The semiconductor manufacturing process as recited in claim 39 further including:*

*depositing of the discontinuous nucleation layer for a timespan between about 1 and 25 seconds.*

*46. The semiconductor manufacturing process as recited in claim 39 further including:*

*a carrier gas comprising a mixture of Argon, Nitrogen, and Helium.*

*47. The semiconductor manufacturing process as recited in claim 46 further including:*

*introducing the silane silicon source gas at about 400 sccm;*

*introducing the reactant gas at about 4 sccm; and*

*introducing a carrier gas at about 2800 sccm.*

* * * * *

UNITED STATES PATENT AND TRADEMARK OFFICE

CERTIFICATE OF CORRECTION

PATENT NO. : RE 40,114 E
APPLICATION NO. : 09/023146
DATED : February 26, 2008
INVENTOR(S) : Sandhu It is certified that error appears in the above-identified patent and that said Letters Patent is hereby corrected as shown below:

In column 6, line 54, in Claim 25, delete “discontinous” and insert -- discontinuous --, therefor.

In column 7, line 44, in Claim 35, after “in” insert -- a --.

Signed and Sealed this

Tenth Day of June, 2008

JON W. DUDAS
*Director of the United States Patent and Trademark Office*